United States Patent [19]

Tajima et al.

[11] 4,158,875
[45] Jun. 19, 1979

[54] AIR COOLING EQUIPMENT FOR ELECTRONIC SYSTEMS

[75] Inventors: Tsuneaki Tajima; Yohichi Matsuo, both of Tokyo, Japan

[73] Assignee: Nippon Electric Co., Ltd., Tokyo, Japan

[21] Appl. No.: 908,612

[22] Filed: May 23, 1978

[30] Foreign Application Priority Data

May 24, 1977 [JP] Japan .................................. 52/60627

[51] Int. Cl.² ............................................. H05K 7/20
[52] U.S. Cl. .................................... 361/384; 361/385; 62/418; 174/16 R
[58] Field of Search ............................... 361/383–385; 62/418; 174/15 HP, 16 R, 16 HS; 165/80, 105

[56] References Cited

U.S. PATENT DOCUMENTS

| | | | |
|---|---|---|---|
| 3,387,648 | 6/1968 | Ward, Jr. | 361/384 |
| 3,749,981 | 7/1973 | Koltuniak | 361/384 |

FOREIGN PATENT DOCUMENTS 997049 7/1973 Canada ...................................... 361/385

*Primary Examiner*—Gerald P. Tolin
*Attorney, Agent, or Firm*—Sughrue, Rothwell, Mion, Zinn and Macpeak

[57] ABSTRACT

An air cooling equipment for use in electronic systems of the type having a plurality of printed circuit wiring boards with a plurality of heat-generating electronic components mounted thereon is disclosed. The air cooling equipment uses a double-walled duct construction whereby air as a coolant is introduced in a direction at high angles to the length of the heat-generating electronic package.

3 Claims, 9 Drawing Figures

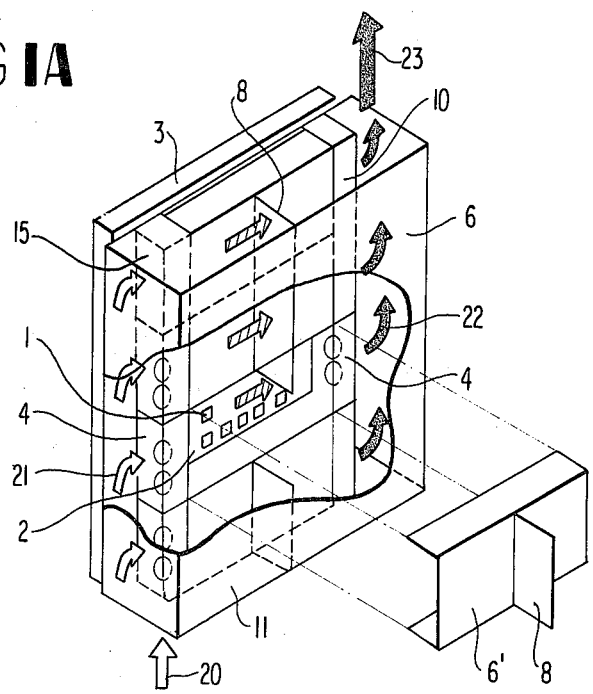
FIG IA
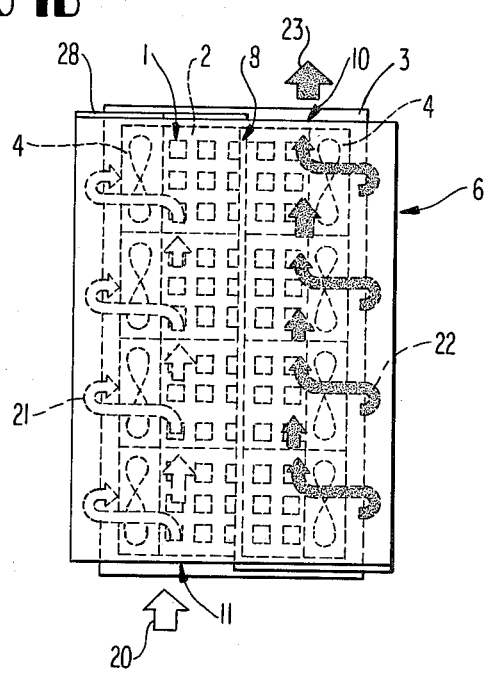
FIG IB
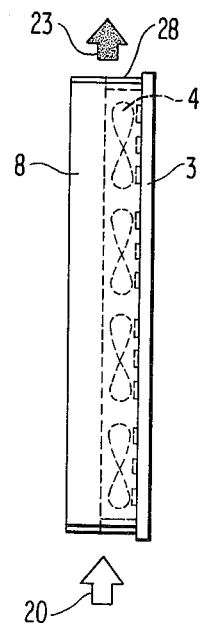
FIG IC
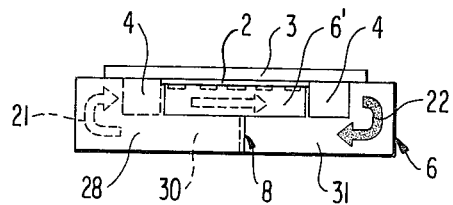
FIG ID

AIR COOLING EQUIPMENT FOR ELECTRONIC SYSTEMS

BACKGROUND OF THE INVENTION

This invention relates to an air cooling equipment for use in electronic systems such as communications systems and information processing systems, and more particularly to an air cooling system for electronic components mounted on printed circuit wiring boards installed in those systems.

In general, active elements such as transistors mounted on the printed circuit wiring board tend to generate heat proportional to the dissipated electric power. The heat produced has an adverse effect on characteristics of the active elements and, if too great, can lead to the destruction of those active elements. For this reason, a strict temperature restriction is imposed on these electronic components to ensure reliability. This restriction is easily met in circuits using only a few active elements; however, an increase in the number of active elements is accompanied with the increase of the electric power dissipation and the quantity of heat produced which must be dissipated. This is typically accomplished by means of a cooling equipment for effectively cooling the electronic components so as to maintain the temperature of the electronic components below their maximum operating temperature.

One attempt for the practical use of such a cooling equipment is disclosed in a liquid cooling system in Japanese Patent Application Disclosure No. 8776/1977 (corresponding to U.S. patent application of Edward A. Wilson et al, Ser. No. 592,578, now U.S. Pat. No. 4,072,188, filed Feb. 7, 1975, and assigned to HONEYWELL INFORMATION SYSTEMS, INC.). However, a complicated mechanism for liquid flow is unavoidable in such a system, which consequently leads to a bulky system. Also, as the system becomes bulky, defective parts tend to occur in the system. As a result, in the event that a hole is found in a liquid passage, liquid leaks therethrough with the result that the intended cooling function cannot be achieved. Another attempt for that purpose is disclosed in a gas (air) cooling system shown in FIG. 194(A) on page 327 of *Heat Transfer In Micro-Electronic Equipment (A Practical Guide)* by J. H. Seely and R. C. Chu, published by Marcel Dekker, Inc., New York in 1972. This system supplies air as a coolant upwards from a blower mounted at the lower end of a support so as to cool electronic components provided on a plurality of component cards. The temperature T of the heat-generating electronic components, when such an air cooling system is used, is given as follows:

$$T = Ta + dTa + dTb + dTc \qquad (1)$$

wherein Ta represents the temperature of a room with a system provided with the electronic components, dTa represents a temperature rise at the inlet of a duct relative to the room temperature, dTb represents a temperature rise measured around those electronic components as compared with the temperature at the inlet of the duct, and dTc represents a temperature difference attributable to the thermal resistance prevailing from ambient air surrounding the electronic components to the components. In this respect, dTa in the second term of the right-hand side of equation (1) is negligible because the air at the room temperature is directly used for the purpose of cooling. Accordingly, the considerations in the design of a cooling system should be paid to a decrease in dTb and dTc in the third and fourth terms of the same side of equation (1), respectively. In this case, dTc is inversely proportional to an air velocity, but if the air velocity exceeds a given level, then the tendency of a decrease in dTc decreases markedly. As a result, an important factor to be considered in cooling the heat-generating electronic components is dTb. The factor dTb is inversely proportional to the flow rate of air supplied as the coolant and decreases with an increase in the flow rate of the coolant air. Meanwhile, the air flow rate varies due to the system resistance increasing in proportion to the length of air passage, thus failing to provide air flow rate of more than a given level. For this reason, in order to obtain the air flow rate required for fully cooling the electronic components, a bulky air blower is needed resulting in a high level of noise.

SUMMARY OF THE INVENTION

It is, therefore, an object of the present invention to provide a cooling equipment free from the above-mentioned shortcomings experienced with the prior art systems by adopting a double-walled duct construction and introducing air as a coolant in the direction at a right angle to the length of the heat-generating electronic package, thereby reducing the system resistance to the air flow passing through a duct so as to increase the flow rate of the coolant air, to thereby maintain the temperature of heat-generating electronic components as low as possible as well as to provide excellent adaptability of the cooling equipment.

The present equipment comprises a plurality of printed circuit wiring boards with a plurality of heat-generating electronic components mounted thereon; a plurality of first covers of a "U" shape which cover said components on said boards and are provided in one-to-one correspondence to said printed circuit wiring boards; a plurality of blowers provided at least on one side at first intake ports and first exhaust ports of a plurality of first air passages defined by said first covers and said printed circuit wiring boards; a second cover having a second intake port adapted to supply air into the first intake ports through a second air passage provided in the same direction as the direction of the initial coolant air delivery, and a second exhaust port adapted to discharge air exhausted from said first exhaust ports of said first air passages in the same direction as that of the initial coolant air delivery from the second intake port, said second cover defining a third air passage in cooperation with the printed circuit wiring boards to cover the first covers and the blowers and a partition wall secured to the first covers and to the second cover so as to separate air of the second intake port provided in the second cover and the second exhaust port.

BRIEF DESCRIPTION OF THE DRAWINGS

The present invention will now be described in more detail in conjunction with the accompanying drawings, in which:

FIGS. 1A to 1D are a perspective view, front view, right-sectional view and plan view of a first embodiment of the invention, respectively;

DESCRIPTION OF THE PREFERRED EMBODIMENTS

Figure 2A:
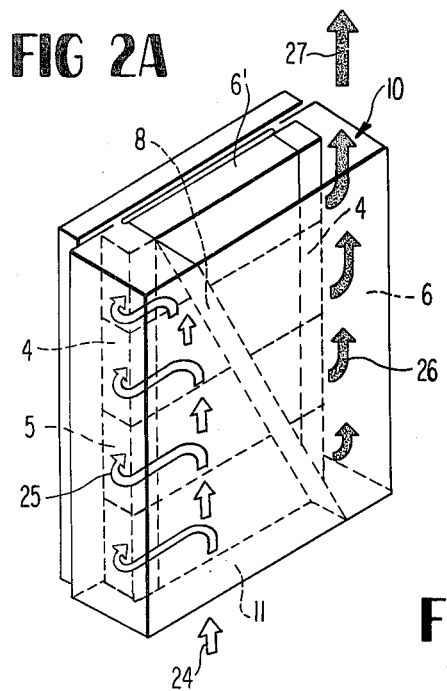
FIGS. 2A to 2D are a perspective view, front view, right-sectional view and plan view of a second embodiment of the invention, respectively.
Figure 2B:
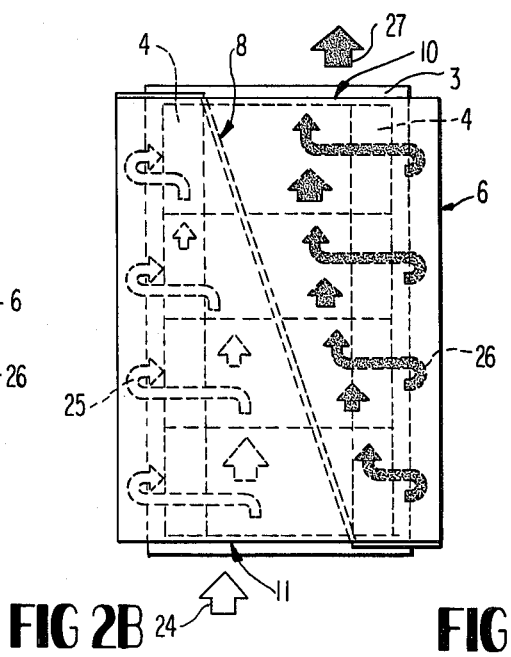
Figure 2C:
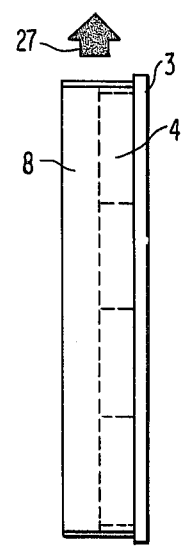
Figure 2D:
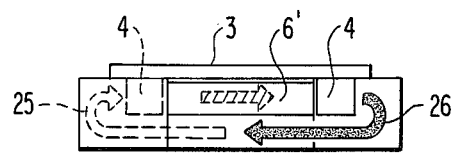

Throughout the respective drawings, unhatched or unshaded arrows denote the direction of air flow passing through a duct which is exclusively used for introducing air therein under suction, hatched arrows indicate the direction of air flow passing through an air passage defined by an inner duct 6', and shaded arrows indicate the direction of warmed air flow passing through a duct which is exclusively used for discharging air outside.

The structural features of the first embodiment of the invention are shown in FIGS. 1A to 1D. A blower 4 is mounted on the opposite side-portions of a support 3. An inner duct 6' covers heat-generating electronic components 1, while an outer duct 6 is divided into two sections by means of a partition wall 8 with one of the sections serving as an exclusive-use intake duct 30 and the other serving as an exclusive-use exhaust duct 31.

Air 20 is introduced as a coolant through an intake port 11 into the intake duct 30. The intake duct 30, as shown in FIG. 1D, has a bottom surface defining the intake port 11 as well as a top surface defined by a seal plate 28 (FIG. 1B). An "L"-shaped space is defined by the partition wall 8, the inner duct 6', and the outer duct 6. Air passing through the inner duct 6' in the direction of a hatched arrow cools the electric components 1 mounted on a printed circuit wiring board 2. The air warmed by the heat produced from the electric components 1 is delivered from the blower 4 into the exhaust duct 31 as shown by shaded arrow 22. Since air in the duct 31 has been warmed, the air may be naturally discharged through the exhaust port 10 in the direction of arrow 23.

The structural features of the second embodiment of the invention are shown in FIGS. 2A to 2D. The partition wall 8 for separating the intake side from the exhaust side of a double-walled duct is so inclined that the cross sectional areas of the intake port 11 and the exhaust port 10 may be both maximized.

Air 24 introduced as a coolant through the intake port 11 flows in the direction of an arrow 25 from the blower 4 into an air passage defined by the inner duct 6' in a manner similar to the first embodiment. According to the second embodiment, the passage defined by the exclusive-use intake duct 30 is progressively narrowed by means of the inclined partition wall 8. Since the cross-sectional area of the intake duct is constant as shown in FIGS. 1A and 1D in the first embodiment, the coolant air 20 introduced under suction is taken into respective blowers 4 in the course of the upward air delivery, thus resulting in a decrease in air flow rate. As a result, the velocity of air flow in the neighborhood of the blowers lacks uniformity. In contrast thereto, according to the second embodiment, the partition wall 8 is so inclined that the cross-sectional area of the duct 30 is reduced in proportion to a decrease in air flow rate in order to achieve a uniform air velocity at the blowers.

Air delivered through the air passage defined by the inner duct 6' and heated by heat produced from the electric component 1 is discharged from the blowers 4 into the exclusive-use exhaust duct 31 in the direction of shaded arrow 26. Thereafter, the warmed air 26 is discharged through the exhaust port 10 outside in the direction of arrow 27. In this respect, the cross-sectional area of the passage defined by the duct 31 is progressively increased upwards by means of the inclined partition wall 8 to accommodate itself to the flow rate of the air 26.

Figure 3:
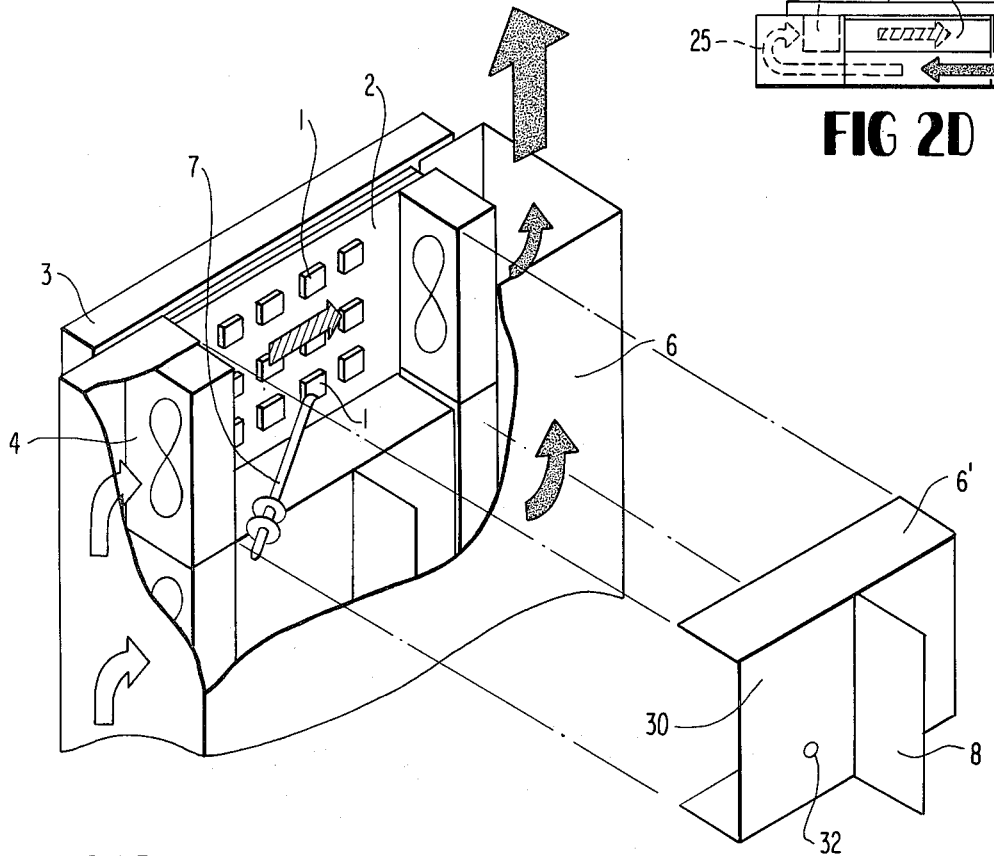
FIG. 3 is a perspective view of one modification of the present invention.

In a modification of the invention, shown in FIG. 3, a thermally conductive member 7 such as a heat pipe and the like is provided with one end thereof contacting the heat-generating electronic component 1 producing a large quantity of heat and with the other end thereof projecting through a hole 32 provided in the inner duct 6' into the exclusive-use intake duct 30, that is, one of the spaces partitioned by the partition wall 8. As a result, the temperature of such an end of the conductive member 7, which contacts the component 1 becomes higher than the temperature within the duct 30 so that heat may be transferred from the component 1 through the member 7 into the intake duct 30. In other words, the member 7 conducts heat from the component 1 into the duct 30. This action takes place in cooperation with heat produced from the component 1 with the aid of coolant air flowing through the inner duct 6' of the double-walled construction. Therefore, the paths to expel heat dissipated are increased in number as compared with the construction free of the member 7. Accordingly, the temperature difference dTc resulting from the thermal resistance prevailing from ambient air surrounding the heat-generating electronic component 1 to this component as shown in equation (1), may be reduced so as to maintain the temperature of the component 1 relatively low. In this respect, though heat transmitted from the component 1 through the conductive member 7 into the intake duct 30 raises the temperature of air in the intake duct 30, it can be neglected, as compared with the total quantity of heat produced from all the heat-generating components 1. Stated differently, a part of heat produced from the component 1, which generates an extremely large quantity of heat, may be dissipated throughout the support 3, thus enhancing the cooling capability.

What is claimed is:

1. Air cooling equipment having a plurality of printed circuit wiring boards with a plurality of heat-generating electronic components mounted thereon, said air cooling equipment comprising:
   a plurality of first covers of a "U" shape which cover said components on said printed circuit wiring boards and are provided in one-to-one correspondence to said printed circuit wiring boards;
   first intake ports and first exhaust ports of a plurality of first air passages defined by said first covers and said boards, blowers provided at selected ones of said ports;
   a second cover having a second intake port adapted to supply air to said first intake ports through a second air passage provided in the same direction as the direction of air delivered as a coolant in said first air passages, and a second exhaust port adapted to discharge air exhausted from said first exhaust ports of said first air passages in the same direction as that of air from the said second intake port, said second cover defining a third air passage in cooperation with said printed circuit wiring boards to cover said boards therewith; and
   a partition wall secured to said first covers and to said second cover so as to separate air of said second intake port provided in the second cover and said second exhaust port.

2. An air cooling equipment as claimed in claim 1, wherein said partition wall is so inclined that the cross-sectional area of said second intake port and said second exhaust port provided in the second cover may be maximized.

3. An air cooling equipment as claimed in claim 1, further comprising at least one thermally conductive member contacting an electronic component mounted on one of said printed circuit wiring boards and projecting through the corresponding one of said first covers into said second air passage.

* * * * *

UNITED STATES PATENT AND TRADEMARK OFFICE
CERTIFICATE OF CORRECTION

PATENT NO. : 4,158,875
DATED : June 19, 1979
INVENTOR(S) : Tsuneaki TAJIMA et al It is certified that error appears in the above-identified patent and that said Letters Patent are hereby corrected as shown below:

IN THE ABSTRACT

Line 7 - delet "high" insert -- right --

Signed and Sealed this

Thirteenth Day of November 1979

[SEAL]

Attest:

RUTH C. MASON
Attesting Officer

LUTRELLE F. PARKER
Acting Commissioner of Patents and Trademarks